United States Patent
Shibata

(10) Patent No.: US 9,350,321 B2
(45) Date of Patent: May 24, 2016

(54) LOW DISTORTION IMPEDANCE SELECTION AND TUNABLE IMPEDANCE CIRCUITS

(75) Inventor: Hajime Shibata, Toronto (CA)

(73) Assignee: Analog Devices, Inc., Norwood, MA (US)

(*) Notice: Subject to any disclaimer, the term of this patent is extended or adjusted under 35 U.S.C. 154(b) by 374 days.

(21) Appl. No.: 13/212,762

(22) Filed: Aug. 18, 2011

(65) Prior Publication Data

US 2013/0043957 A1 Feb. 21, 2013

(51) Int. Cl.
| | |
|---|---|
| H03B 5/12 | (2006.01) |
| H03C 3/09 | (2006.01) |
| H03H 11/24 | (2006.01) |
| H03B 5/00 | (2006.01) |

(52) U.S. Cl.
CPC ............ H03H 11/245 (2013.01); *H03B 5/00* (2013.01); *H03B 2201/011* (2013.01); *H03B 2201/018* (2013.01); *H03B 2201/025* (2013.01); *H03B 2201/0208* (2013.01)

(58) Field of Classification Search
CPC ............ H03B 2201/0208; H03B 2201/011; H03B 2201/018; H03B 2201/025; H03B 5/00; H03H 11/245
USPC ...... 331/108 R, 36 C, 117 R, 167, 177 V, 179; 327/581
See application file for complete search history.

(56) References Cited

U.S. PATENT DOCUMENTS

| | | | |
|---|---|---|---|
| 5,969,657 A | | 10/1999 | Dempsey et al. |
| 6,803,800 B2 * | | 10/2004 | Chen .............................. 327/333 |
| 7,038,527 B2 | | 5/2006 | Titus et al. |
| 7,514,953 B2 * | | 4/2009 | Perisetty .......................... 326/27 |
| 8,044,739 B2 * | | 10/2011 | Rangarajan et al. .......... 331/167 |
| 2006/0145771 A1 | | 7/2006 | Strange |
| 2007/0085613 A1 * | | 4/2007 | Pittorino ...................... 331/36 C |
| 2010/0259319 A1 * | | 10/2010 | Chan et al. ..................... 327/563 |
| 2011/0025403 A1 * | | 2/2011 | Cassia ............................ 327/434 |
| 2011/0148503 A1 * | | 6/2011 | Granger-Jones et al. ..... 327/308 |
| 2011/0319036 A1 * | | 12/2011 | Tse-Peng ......................... 455/76 |
| 2012/0256271 A1 * | | 10/2012 | Wei et al. ....................... 257/379 |

OTHER PUBLICATIONS

Analog Devices, Inc., "IF Digitizing Subsystem," AD9874 Datasheet, Rev. A, pp. 1-40, Mar. 2003.
A.D. Berny et al., "A 1.8-GHz LC VCO with 1.3-GHz Tuning Range and Digital Amplitude Calibration," IEEE Journal of Solid-State Circuits, vol. 40, No. 4, pp. 909-917, Apr. 2005.

* cited by examiner

*Primary Examiner* — Richard Tan
(74) *Attorney, Agent, or Firm* — Patent Capital Group

(57) ABSTRACT

A tunable impedance circuit can include a fixed impedance and one or more impedance selection circuits. Each impedance selection circuit can include a first impedance connected to a first interface terminal, a second impedance connected to a second interface terminal, and a plurality of series-connected transistors connected between the first and second impedances. Each impedance selection circuit can also include a plurality of drive impedance networks connected to gates, sources, drains, bodies, and isolation regions of the series-connected transistors, and a control circuit to provide a plurality of control signals to the drive impedance networks to turn on and turn off the series-connected transistors. For each impedance selection circuit, turning on and turning off the respective plurality of series-connected transistors can bring the series combination of the respective first and second impedances into and out of electrical communication with, e.g., into and out of parallel with, the fixed impedance.

28 Claims, 6 Drawing Sheets

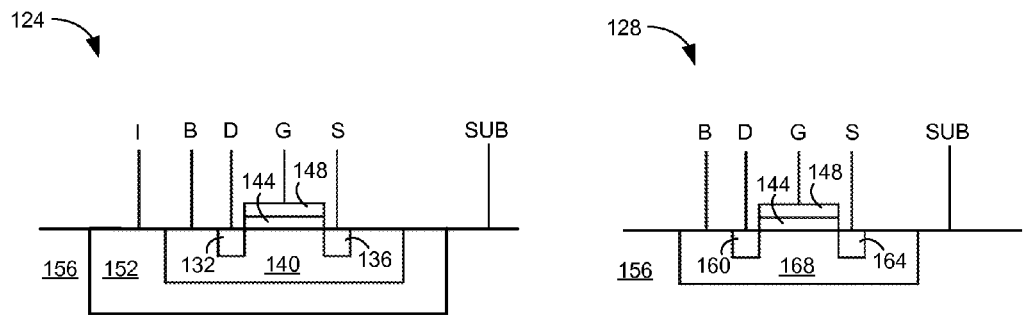
FIG. 8   FIG. 9
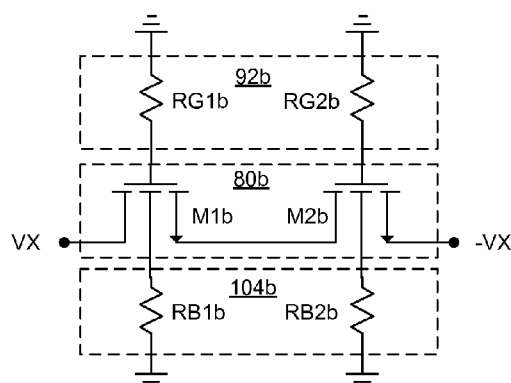   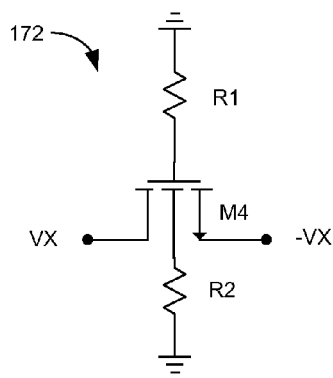
FIG. 10A   FIG. 11A
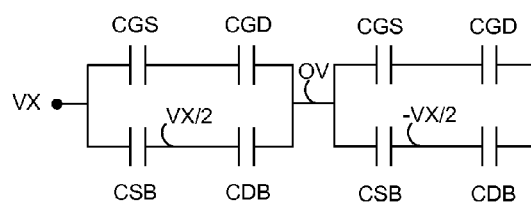   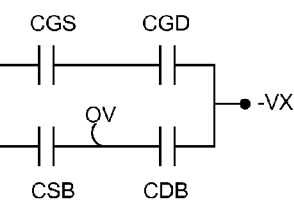
FIG. 10B   FIG. 11B

LOW DISTORTION IMPEDANCE SELECTION AND TUNABLE IMPEDANCE CIRCUITS

BACKGROUND

A tunable impedance presents an impedance value, to a larger circuit system, that is tunable in response to a control signal. Tunable impedances find use in a variety of circuits, including voltage-controlled oscillators, continuous-time filters and others. Such circuits occur in a myriad of applications, such as communications, processing, etc.

FIG. 1 depicts an embodiment of an oscillator circuit 20 having a tunable inductor-capacitor combination 24. The oscillator circuit includes a pair of cross-coupled transistors 28, 30 and a voltage-controlled current source 32. The tunable inductor-capacitor combination 24 includes an inductor L1 and a tunable capacitor CT connected in parallel across respective drains of the cross-coupled pair 28, 30. The inductor L1 is connected to an upper power supply VDD at a center tap. The cross-coupled pair 28 is supplied with a current from the voltage-controlled current source 32. The current source 32 includes a plurality of transistors MA-1 to MA-X (collectively, MA) selectively connected, through a plurality of switches SA-1 to SA-X and SB-1 to SB-X (collectively, SA, SB), to a reference current source I1 through a current-mirror transistor configuration 36. A plurality of control signals supplied to the switches SA, SB connecting the transistors MA to the current mirror 36 control the total current supplied by the voltage-controlled current source 32 to the cross-coupled pair 28, 30.

In operation, the cross-coupled transistors 28, 30 induce an oscillation, across the inductor-capacitor combination 24, having a frequency controlled by the impedance values of the inductor L1 and tunable capacitor CT. In FIG. 1, the inductor L1 has a fixed inductance value and the capacitor CT a selectable capacitance value, and the oscillation frequency can thus be controlled by selecting the capacitance value of the tunable capacitor CT.

FIG. 2 depicts an embodiment of a tunable capacitor 40 that is used to implement the capacitor CT of the oscillator 20. The tunable capacitor 40 includes a fixed capacitance CA in parallel with a plurality of selectable capacitance branches 44A-44X. Each selectable capacitance branch 44-1 to 44-X (collectively, 44) includes first and second capacitances CB-1 to CB-X and CC-1 to CC-X (collectively, CB, CC) connected in series with a centrally situated selection switch SC-1 to SC-X (collectively, SC). In operation, the capacitance value of the tunable capacitance 40 can be controlled by selectively enabling and disabling the selection switches SC of the selectable capacitance branches 44. For example, with none of the selection switches SC enabled, the tunable capacitance 40 can have a value equal to that of the fixed capacitance CA. Enabling of a particular selection switch SC can then bring the series combination of the respective first and second capacitances CB, CC in parallel with the fixed capacitance CA, thereby modifying the overall tunable capacitance value.

One problem encountered in realizing the tunable capacitor structure 40 of FIG. 2 is distortion introduced by the selection switch SC into the selectable capacitance branches 44, the tunable capacitor 40 and containing circuits. FIG. 3 depicts an embodiment of a transistor realization of the selectable capacitance branch 44. In FIG. 3, the selection switch SC can be implemented by a single n-channel metal-oxide-semiconductor (NMOS) transistor MB. A control circuit can include a pair of inverters INV1, INV2 to provide drive signals to enable and disable the switch transistor MB. A first drive signal can be provided to the gate of the transistor MB, and a second drive signal can be provided to the source and drain of the transistor MB through a pair of corresponding impedances RA, RB.

Distortion can be introduced by the selection switch SC in both its on and off states. When the switch SC is on, the embodiment of FIG. 3 can present the on-resistance of the transistor MB between the first and second capacitances CB, CC of the capacitance branch 44. The presence of the on-resistance can introduce distortion as the on-resistance can be a function of the differential signal appearing across the tunable capacitance 40. This transistor on-resistance can typically depend inversely on the width-to-length ratio of the transistor. The distortion caused by the on-resistance of the selection transistor MB can thus be reduced by increasing the width-to-length ratio of the transistor, thereby reducing the on-resistance, the voltage appearing across on-resistance, and the resulting distortion.

However, increasing the width of the switch transistor MB, to reduce the on-resistance distortion contribution in the on state, may adversely affect the distortion contribution of the switch in the off state. In a typical complimentary metal-oxide-semiconductor CMOS) process, the drain-to-body and source-to-body paths of a transistor are PN junctions. FIG. 4 depicts a circuit modeling the selectable capacitance branch 44 of FIG. 3 and connected portions of an embodiment 20b of the oscillator circuit of FIG. 1, and illustrating the drain-to-body and source-to-body PN junctions as two diodes D1, D2. Although these diodes D1, D2 can be illustrated in FIG. 4 as separate components for explanation purposes, they are inherent to and part of the switch transistor MB, as indicated by the use of dashed-line connections. When the switch transistor MB is off, these junction diodes D1, D2 can be reverse biased, and present associated non-linear parasitic capacitances between the drain and body and between the source and body (i.e., source-to-body and drain-to-body parasitic capacitances CSB, CDB, as illustrated in FIGS. 10B, 11B, and 12B and discussed below). Any differential voltage present across the tunable capacitance in the off state can appear at the junction capacitances, and resulting corresponding current can be injected into connected portions of the oscillator circuit 20b, thereby introducing distortion. The size of this distortion current can increase with the size of the junction capacitances, which in turn can depend on the width of the transistor MB. Thus, although increasing the width of the switch transistor MB may reduce the distortion in the on state, it may increase the distortion in the off state.

A need therefore exists for impedance selection circuits, tunable impedances, and containing circuits that have low distortion in both on and off impedance selection states.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

FIG. 8 is a cross-sectional diagram depicting an embodiment of an NMOS transistor.

FIG. 9 is a cross-sectional diagram depicting an embodiment of a PMOS transistor.

FIGS. 10A-10B are circuit schematics depicting AC circuit models of portions of an embodiment of the impedance selection circuit of FIGS. 6-7, having two series-connected switch transistors.

FIGS. 11A-11B are circuit schematics depicting AC circuit models of an embodiment of a single-transistor selection switch.

DETAILED DESCRIPTION

A low-distortion tunable impedance circuit can include a fixed impedance and a plurality of impedance selection circuits. The impedance selection circuit can include a pair of selectable impedances connected at both ends of a plurality of series-connected switch transistors. Terminals of the plurality of series-connected transistors, including gate, source, drain, body and isolation region terminals, can be driven by a plurality of drive impedance networks in response to a plurality of control signals from a control circuit. The impedance selection circuit can provide improved off-state distortion performance by reducing voltages appearing across source-to-body and drain-to-body parasitic capacitances of the series-connected switch transistors to reduce associated off-state distortion currents. The impedance selection circuit can also provide improved on-state distortion performance by maintaining a low effective on-resistance of the switch-transistor series combination by increasing the width of the plurality of transistors to compensate for an increased effective transistor length of the series combination.

The off-state distortion of the impedance selection circuit can be represented by a third order off-state distortion current, which can be $1/N^2$ times smaller than a corresponding distortion current of a single transistor selection switch having the same on-resistance as the impedance selection circuit, where N is equal to the number of the plurality of series-connected transistors of the impedance selection circuit. The third order distortion current can be reduced by reducing the voltage across the parasitic source-to-body and drain-to-body capacitances of the series-connected transistors, while still sizing the impedance selection circuit switch transistors to maintain the same effective on-resistance as a single switch transistor embodiment. Impedances of the drive impedance networks can have values selected to enable the improved distortion performance of the impedance selection circuit. The drive impedance values can be selected to be sufficiently large to effectively electrically float the respective terminals or nodes that they drive when the series-connected transistors are off, to enable substantially even voltage division across the source-to-body and drain-to-body capacitances of the plurality of series-connected transistors.

Figure 2:
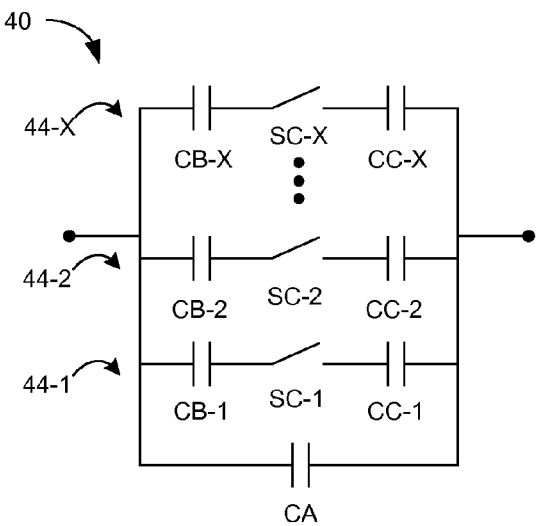
FIG. 2 is a circuit schematic depicting an embodiment of the tunable capacitance of FIG. 1.
Figure 3:
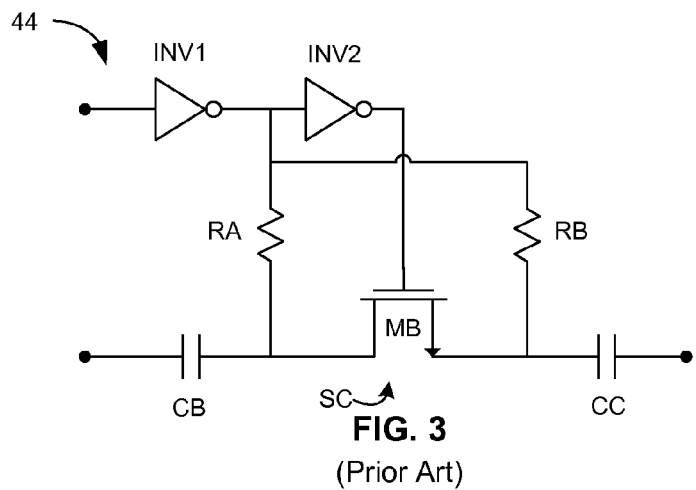
FIG. 3 is a circuit schematic depicting an embodiment of a selectable capacitance branch of the tunable capacitance of FIG. 2.
Figure 5:
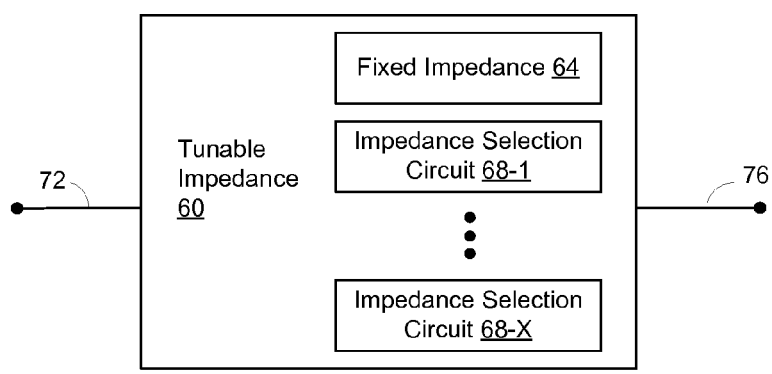
FIG. 5 is a circuit schematic depicting an embodiment of a tunable impedance.

FIG. 5 depicts an embodiment of a tunable impedance circuit 60. The tunable impedance 60 can include a fixed impedance circuit 64 and a plurality of impedance selection circuits 68 (e.g., 68-1 to 68-X) connected between two interface terminals 72, 76. The tunable impedance 60 can be included in any circuit by connecting the tunable impedance interface terminals 72, 76 to any two circuit nodes between which a tunable impedance is desired. The fixed impedance 64 can provide a default impedance value if no selectable impedances are selected. The plurality of impedance selection circuits 68 can each be individually selected to correspondingly modify the overall impedance value of the tunable impedance 60 from the default impedance value. The fixed impedance 64 and impedance selection circuits 68 can be arranged between the tunable impedance terminals 72, 76 in parallel with each other, in series with each other, or in any combination thereof. For example, the fixed impedance 64 and each of the plurality of impedance selection circuits 68 can be arranged between the tunable impedance interface terminals 72, 76 in parallel with each other to give a tunable impedance structure similar to that shown in FIG. 2.

Figure 6:
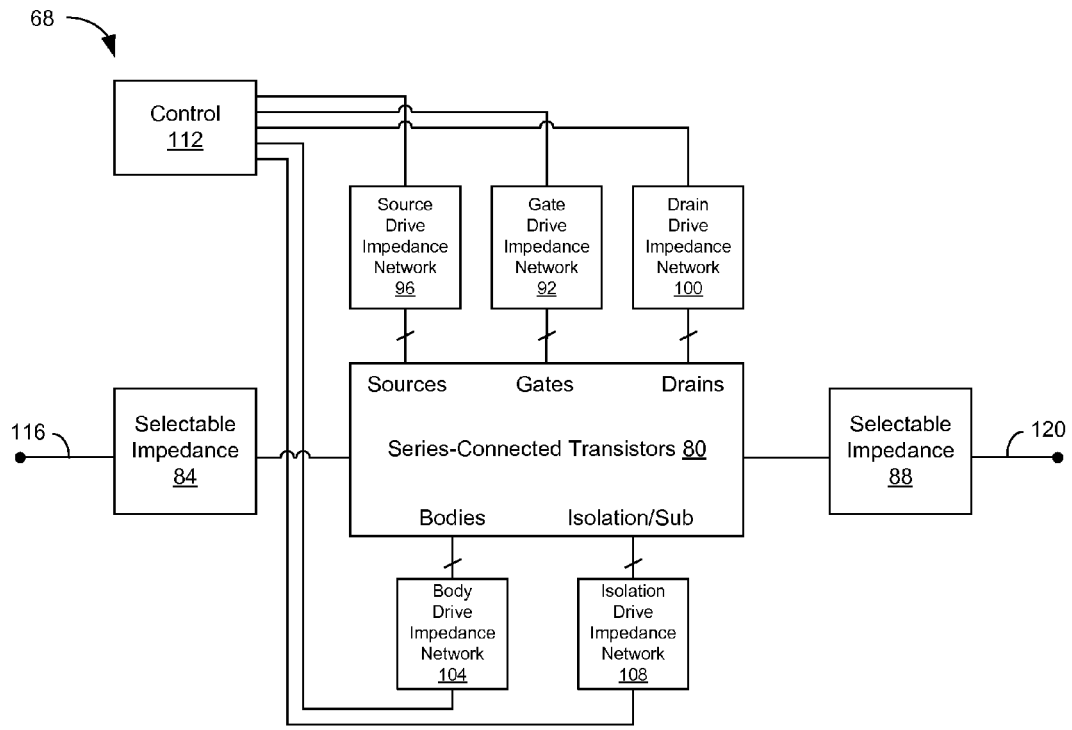
FIG. 6 is a circuit schematic depicting an embodiment of an impedance selection circuit of the tunable impedance of FIG. 5.

FIG. 6 depicts an embodiment of the impedance selection circuit 68. The impedance selection circuit 68 can include a plurality of series-connected transistors 80, a pair of selectable impedances 84, 88, a plurality of drive impedance networks 92, 96, 100, 104, 108, and a control circuit 112. The selectable impedances 84, 88 and plurality of series-connected transistors 80 can be connected in series between first and second interface terminals 116, 120, with a first of the selectable impedances 84 connected to a first of the interface terminals 116, the plurality of series-connected transistors 80 connected to the first selectable impedance 84, and a second of the selectable impedances 88 connected to the plurality of series-connected transistors 80 and the second interface terminal 120.

The plurality of drive impedance networks 92-108 can include drive impedance networks corresponding to the gate, source, drain, body and isolation terminals of the plurality of series-connected transistors 80. A plurality of connection lines can connect the gate, source, drain, body and isolation terminals of the series-connected transistors 80 to the control circuit 112 through the plurality of corresponding drive impedance networks 92-108. In more detail, one or more connection lines can connect the sources of the transistors 80 to a corresponding source drive impedance network 96, and one or more lines can connect the source drive impedance network 96 to the control circuit 112. One or more connection lines can connect the gates of the transistors 80 to a corresponding gate drive impedance network 92, and one or more lines can connect the gate drive impedance 92 network to the control circuit 112. One or more connection lines can connect the drains of the transistors 80 to a corresponding drain drive impedance network 100, and one or more lines can connect the drain drive impedance 100 network to the control circuit 112. One or more connection lines can connect the bodies of the transistors 80 to a corresponding body drive impedance network 104, and one or more lines can connect the body drive impedance network 104 to the control circuit 112. One or more connection lines can connect the isolation, or deep well, regions of the transistors 80 to a corresponding isolation drive impedance network 108, and one or more lines can connect the isolation drive impedance network 108 to the control circuit 112.

The impedance selection circuit 68 can also optionally include only a subset of the plurality of drive impedance networks 92-108 corresponding to the gate, source, drain, body and isolation terminals of the plurality of series-connected transistors 80. For example, as discussed below, PMOS transistors may not include isolation region terminals, and therefore the impedance selection circuit 68 can optionally omit the isolation drive impedance network 108, or portions thereof, corresponding to PMOS transistors of the plurality of series-connected transistors 80. Similarly, while the isolation drive impedance network 108 can provide distortion performance benefits related to NMOS transistors of embodiments of the series-connected transistors 80, the impedance selection circuit 68 can also optionally omit the isolation drive impedance network 108, or portions thereof, corresponding to NMOS transistors of the plurality of series-connected transistors 80.

Each of the drive impedance networks 92-108 can include one or more impedances to drive corresponding terminals of the plurality of series-connected transistors 80. For example, the gate, body and isolation drive impedance networks 92, 104, 108 can include a separate drive impedance for each gate, body and isolation region terminal of the series-connected transistors. In more detail, the gate drive impedance network 92 can include a separate gate drive impedance for each gate of the plurality of series-connected transistors 80, the body drive impedance network 104 can include a separate body drive impedance for each body of the plurality of series-connected transistors 80, and the isolation drive impedance network 108 can include a separate isolation drive impedance for each isolation region of the plurality of series-connected transistors 80. The source and drain drive impedance networks 96, 100 can together include a separate drive impedance for each unique circuit node connected to a source or drain of the series-connected transistors 80.

Alternatively, although individual separate drive impedances for individual terminals of each of the plurality of series connected transistors 80 can provide distortion performance benefits, one or more of the drive impedance networks 92-108 may include a single drive impedance to collectively drive all of the corresponding terminals of the plurality of series-connected transistors 80. For example, the isolation drive impedance network 108 can optionally include a single isolation drive impedance to drive all of the isolation regions of the plurality of series-connected transistors 80. Such an configuration can be useful, e.g., in embodiments where the plurality of series-connected transistors 80 share a single isolation region.

The impedances of the impedance drive networks 92-108 can include separate, dedicated impedances, such as resistors, or can be output resistances of other drive circuitry, such as output resistances of drive transistors.

The values of the impedances of the impedance drive networks 92-108 can be selected to enable the improved distortion performance of the impedance selection circuit 69. As discussed further below, individual drive network impedances can be selected to be sufficiently large to effectively electrically float respective terminals or nodes that they drive, or to approximate such a floating state, when the series-connected transistors 80 are off, to enable substantially even voltage division across the source-to-body and drain-to-body capacitances of the plurality of series-connected transistors 80, which can enable an improved distortion performance of the impedance selection switch 68.

The control circuit 112 can provide a plurality of control signals to the terminals of the plurality of series-connected transistors 80 through the plurality of drive impedance networks 92-108. The control signals can turn on and off the plurality of transistors 80, and set operating conditions at the gate, source, drain, body and isolation terminals to both reduce the distortion introduced by the source-to-body and drain-to-body parasitic capacitances of the transistors 80 in the off state and maintain a low on-resistance distortion of the transistors 80 in the on state. Exemplary embodiments of the control signals are discussed in more detail below.

Figure 7:
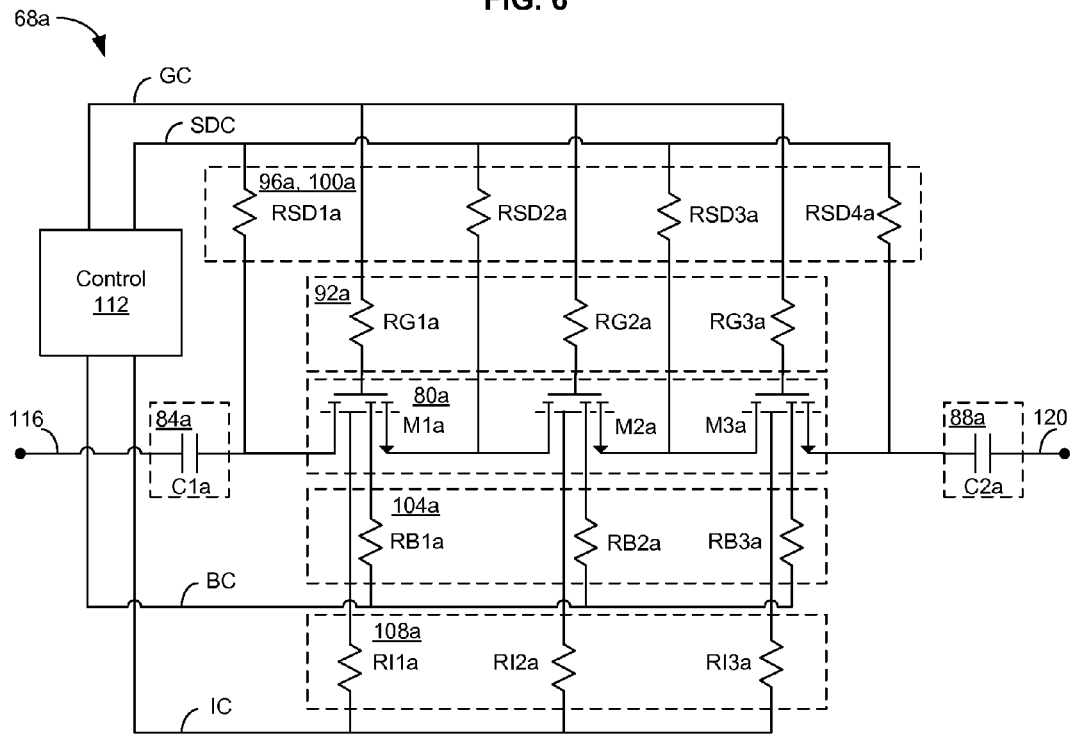
FIG. 7 is a circuit schematic depicting an embodiment of the impedance selection circuit of FIG. 6.

FIG. 7 depicts an embodiment 68a of the impedance selection circuit 68 depicted in FIG. 6. In FIG. 7, the selectable impedances 84a, 88a include selectable capacitors C1a, C2a, and the plurality of series-connected transistors 80a can include three series-connected transistors M1a, M2a, M3a. A first selectable capacitor C1a can be connected to the first interface terminal 116 of the impedance selection circuit 68a, a first of the series-connected switch transistors M1a can have a drain connected to a second terminal of the first selectable capacitor C1a, a second of the series-connected switch transistors M2a can have a drain connected to a source of the first switch transistor M1a, a third of the series-connected switch transistors M3a can have a drain connected to a source of the second switch transistor M2a, and a second selectable capacitor C2a can be connected to a source of the third switch transistor M3a and to the second interface terminal 120 of the impedance selection circuit 68.

Connection lines can connect each terminal of the plurality of series-connected switch transistors 80 to the control circuit 112 through a corresponding drive resistor. In more detail, connection lines can connect each gate of the switch transistors 80a to a corresponding gate drive resistor RG1a-RG3a, and the corresponding gate drive resistor RG1a-RG3a to a first control line of the control circuit 112 providing a gate control signal GC. Connection lines can connect each source or drain of the switch transistors 80a to a corresponding source and drain drive resistor RSD1a-RSD4a, and the corresponding source and drain drive resistor RSD1a-RSD4a to a second control line of the control circuit providing a source and drain control signal SDC. Connection lines can connect each body of the switch transistors 80a to corresponding body drive resistor RB1a-RB3a, and the corresponding body drive resistors RB1a-RB3a to a third control line of the control circuit 112 providing a body control signal BC. Connection lines can connect each isolation region of the switch transistors 80a to a corresponding isolation drive resistor RI1a-RI3a, and the corresponding isolation drive resistors RI1a-RI3a to a fourth control line of the control circuit 112 providing an isolation control signal IC.

The plurality of series-connected transistors 80 can be of common transistor types. In FIG. 7, the plurality of series-connected transistors 80a can include all NMOS transistors. In other embodiments, the plurality of series-connected transistors 80 can include all p-channel metal-oxide-semiconductor (PMOS) transistors. FIGS. 8 and 9 depict embodiments of cross-sections of an NMOS and a PMOS transistor 124, 128, respectively, fabricated in a CMOS process, that can be used to compose embodiments of the plurality of series-connected transistors 80. In FIG. 8, the exemplary NMOS transistor 124 can include n-type semiconductor source and drain regions 132, 136, a p-type semiconductor body region 140 containing the source and drain regions 132, 136, dielectric and conductive gate layers 144, 148 above the body region 140 between the source and drain 132, 136, an n-type semiconductor deep well isolation region 152 containing the p-type body region 140, and a p-type semiconductor substrate region 156 containing the isolation region. The NMOS transistor can have source S, drain D, gate G, body B, isolation I, and substrate SUB terminals providing electrical connections to these regions. In FIG. 9, the exemplary PMOS transistor 128 can include p-type semiconductor source and drain regions 160, 164, an n-type semiconductor body region 168 containing the source and drain regions 160, 164, dielectric and conductive gate layers 144, 148 above the body region 168 between the source and drain 160, 164, and a p-type semiconductor substrate region 156 containing the body region 168. The PMOS transistor can have source S, drain D, gate G, body B, and substrate SUB terminals providing electrical connections to these regions.

The NMOS and PMOS transistor embodiments 124, 128 of FIGS. 8-9 both can provide electrical isolation of the corresponding body regions 140, 168 from the containing substrate regions 156. The body 168 of the PMOS transistor 128 of FIG. 9 can be naturally electrically isolated from its containing substrate region 156 because it can be necessarily of a different semiconductor type, i.e., n-type, than that of a p-type semiconductor substrate region 156. The body 140 of the NMOS transistor 124 of FIG. 8 can be electrically isolated from its containing substrate region 156 through the use of the n-type deep well region 152 between the p-type body region 140 and p-type substrate region 156. The p-type body 140 of the NMOS transistor 124 of FIG. 8 can also be electrically isolated from its containing n-type deep well region 152 as these regions can also be different semiconductor doping types.

A plurality of NMOS and PMOS transistors, such as those depicted in FIGS. 8-9, can be fabricated on and in a single common substrate, which can typically be a p-type semiconductor substrate including the p-type substrate regions 156 of the embodiments depicted in FIGS. 8-9. Each individual NMOS and PMOS transistor can thus have its own individually electrically isolated body region, and each NMOS transistor can also have its own individually electrically isolated deep well, or isolation, region. Alternatively, a plurality of PMOS transistors can optionally share a single body region, a plurality of NMOS transistors can optionally share a single body region, and a plurality of NMOS transistors can optionally share a single deep well isolation region. Other embodiments can include various combinations of separate and shared bodies and isolation regions.

The plurality of series-connected transistors 80 can therefore each include individually electrically isolated bodies and isolation regions. The body drive and isolation drive impedance networks 104, 108 can accordingly connect to individually electrically isolated bodies and isolation regions of each of the plurality of series-connected transistors 80. In FIG. 7, the body drive and isolation drive impedance networks 104a, 108a can connect to individually electrically isolated bodies and isolation regions of each of the plurality of series-connected NMOS transistors 80a. Alternatively, the plurality of series-connected transistors 80 can include various embodiments of electrically connected bodies and isolation regions, and the body drive and isolation drive impedance networks 104, 108 can accordingly connect to corresponding electrically connected bodies and isolation regions of the series-connected transistors 80. For example, the plurality of series-connected transistors 80 can include a plurality of NMOS transistors sharing a single deep well isolation region, and thus effectively have electrically connected isolation region terminals, and the isolation drive impedance network 108 can connect to such an effectively single collective isolation region terminal of the plurality of series-connected transistors. Also note that, as discussed above, the impedance selection circuit 68 can optionally omit the isolation drive network for embodiments of the plurality of series-connected transistors 80 including PMOS transistors, NMOS transistors, or combinations thereof.

Figure 4:
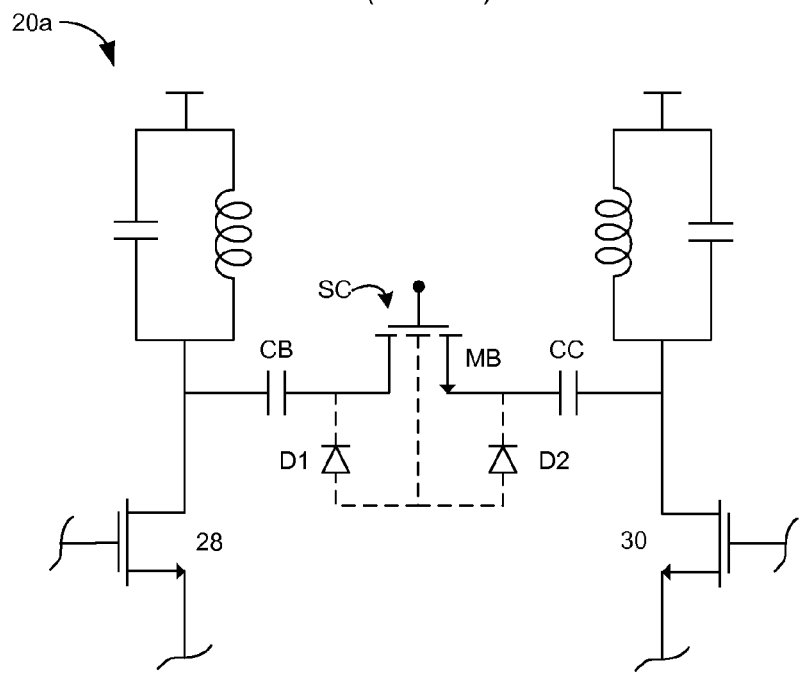
FIG. 4 is a circuit schematic depicting an embodiment of portions of the oscillator, tunable capacitance and selectable capacitance branches of FIGS. 1-3.

The impedance selection circuit 68 can provide improved distortion performance in comparison to other selection switch embodiments, such as a single transistor selection switch. The improved distortion properties of the impedance selection circuit 68 can be discussed with reference to FIGS. 10A-10B, 11A-11B and 12A-12B. FIGS. 10A-10B depict AC circuit models of portions of an embodiment of the impedance selection circuit 68 having two series-connected transistors 80b. FIG. 10A depicts an AC circuit model of first and second series-connected transistors M1b, M2b along with a corresponding gate drive impedance network 92b, having first and second gate drive impedances RG1b, RG2b, and body drive impedance network 104b, having first and second body drive impedances RB1b, RB2b. FIG. 10B depicts an AC circuit model of parasitic capacitances of the two series-connected transistors 80b of the two-transistor embodiment of the impedance selection circuit 68. The parasitic capacitances can include a gate-to-source capacitance CGS, a gate-to-drain capacitance CGD, a source-to-body capacitance CSB, and a drain-to-body capacitance CDB. The source-to-body and drain-to-body capacitances CSB, CDB can correspond to the parasitic capacitances discussed in regard to the source-to-body and drain-to-body inherent junction diodes D1, D2 of FIG. 4.

Figure 1:
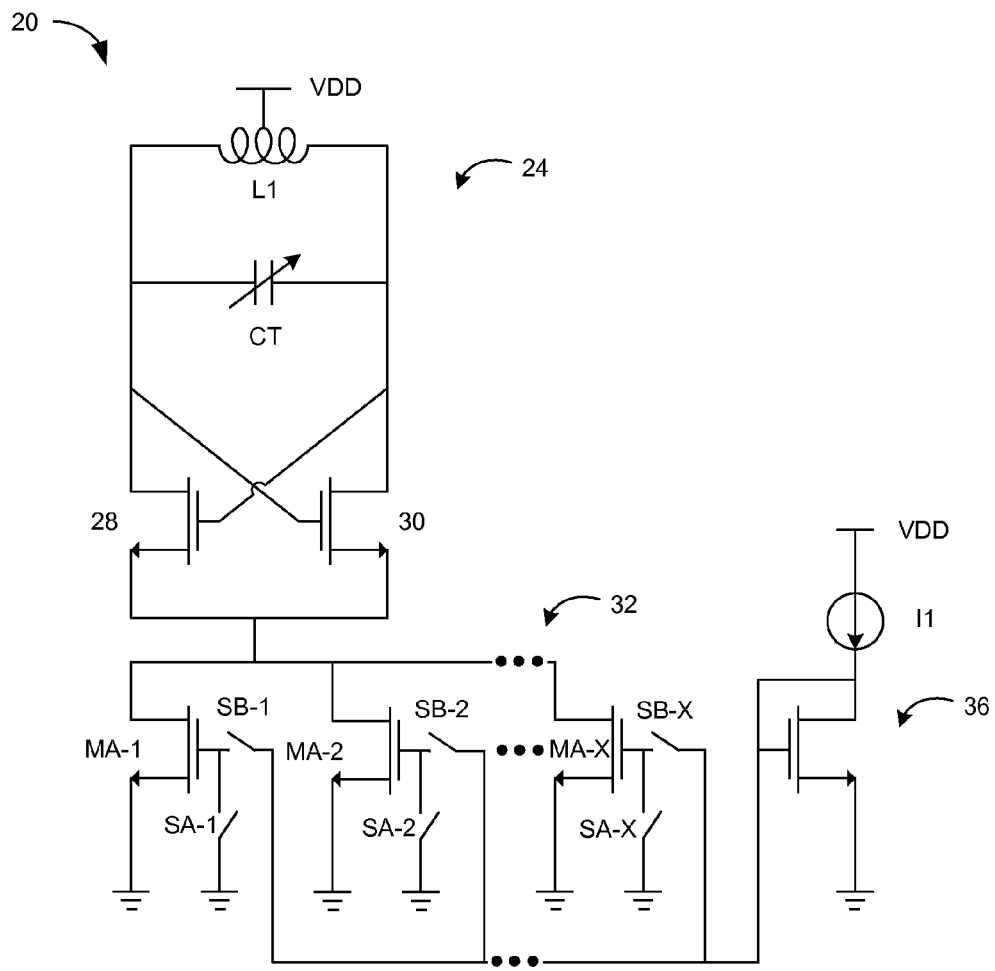
FIG. 1 is a circuit schematic depicting an embodiment of an oscillator having a tunable capacitance.

In operation, for example as part of the oscillator 20 of FIG. 1, a differential voltage VX−(−VX) can appear across the combination of the two series-connected transistors 80b when the transistors 80b are off. The impedance networks 92b, 104b can present selected impedance values to the gates and bodies so that the differential voltage VX−(−VX) appearing across the series transistor combination 80b divides substantially evenly across each of the series combination of the source-to-body, drain-to-body, drain-to-body, and source-to-body capacitances CSB, CDB, CSB, CDB of the two transistor combination 80b. For example, the impedance networks 92b, 104b can present selected impedance values to the bodies so that, given a differential voltage VX−(−VX) appearing across the two transistor series combination 80b, a differential voltage VX/2−(−VX/2) appears across the intermediate nodes between the source-to-body and drain-to-body parasitic capacitance CSB, CDB of the first and second of the two series-connected transistors 80b, and a zero differential voltage 0V appears at the intermediate node between the drain-to-body parasitic capacitance CDB of the first of the two series-connected transistors 80b and the source-to-body parasitic capacitance CSB of the second of the two series-connected transistors 80b.

Note that specific voltage values, e.g., VX, at specific circuit nodes, discussed above in regard to FIGS. 10A-10B, as well as below in regard to FIGS. 11A-11B and 12A-12B, can be considered to be as part of differential voltages, and absolute voltages at such circuit nodes may vary according to overall voltage conditions present in containing circuits.

The third order non-linear current flowing through the source-to-body and drain-to-body capacitances CSB, CDB can represent the relative degree of distortion imparted by the source-to-body and drain-to-body capacitances CSB, CDB into the impedance selection circuit 68 and any containing circuit. The third order current flowing through the source-to-body capacitance can be represented as $I3SB=VSB^3/ZSB$, where VSB is the voltage across the source-to-body capacitance CSB and ZSB is the impedance of the source-to-body capacitance CSB. This third order current representation can be rewritten as I3SB=s CSB VSB$^3$, where s is the complex impedance parameter. Similarly, the third order non-linear current flowing through the drain-to-body capacitance can be represented as I3DB=s CDB VDB$^3$, where VDB is the voltage across the drain-to-body capacitance CDB. With a symmetric transistor design, the source-to-body and drain-to-body capacitances CSB, CDB can have equal or similar capacitance values and selection of the body drive impedances RB1$b$, RB2$b$ to be sufficiently high can ensure the third order current flowing through the source-to-body and drain-to-body capacitances CSB, CDB can be similar or the same. For purposes of eventual comparison between the models of FIGS. 10A-10B and those of FIGS. 11A-11B and 12A-12B, each transistor M1$b$, M2$b$ of FIGS. 10A-10B can have a width of 2 W and a length of L, and thus a width-to-length ratio having a value of 2 W/L. The source-to-body and drain-to-body capacitances CSB, CDB of each of the transistors M1$b$, M2$b$ of the two-transistor series combination 80$b$ of FIGS. 10A-10B can be modeled as having a value of 2 C. With VX/2 appearing across both the source-to-body and drain-to-body capacitances CSB, CDB of both transistors M1$b$, M2$b$, the third order non-linear distortion current contributed by the source-to-body and drain-to-body capacitances CSB, CDB of the two-transistor series combination 80$b$ can be represented as I3=s CSB (VX/2)$^3$=s CDB (VX/2)$^3$=(¼) s C VX$^3$.

The third order distortion current performance of the impedance selection circuit 68 can be compared to that of a single-transistor impedance selection switch. FIGS. 11A-11B depict AC circuit models of a single-transistor impedance selection switch 172. FIG. 11A depicts an AC circuit model of a single transistor M4 along with a gate drive impedance R1 and a body drive impedance R2. FIG. 11B depicts an AC circuit model of parasitic capacitances of the single switch transistor M4. Similar to the transistor model of FIG. 10B, the parasitic capacitances can include a gate-to-source capacitance CGS, a gate-to-drain capacitance CGD, a source-to-body capacitance CSB, and a drain-to-body capacitance CDB. For purposes of comparison between the models of FIGS. 10A-10B and 11A-11B, the transistor M4 of FIGS. 11A-11B can have a width of W and a length of L, and thus a width-to-length ratio having a value of W/L. The on-resistance of a transistor can inversely depend on the width-to-length of the transistor, and the source-to-body and drain-to-body capacitances CSB, CDB can be modeled as directly depending on the width of the transistor. Thus, given the same transistor length with differing widths, the two-transistor series combination 80$b$ of FIGS. 10A-10B and the single transistor M4 of FIGS. 11A-11B can have the same effective on-resistance, but the source-to-body and drain-to-body capacitances CSB, CDB of the larger transistors M1$b$, M2$b$ of FIGS. 10A-10B can each be modeled as twice as large as the corresponding capacitance of the smaller transistor M4 of FIGS. 11A-11B. Thus, the source-to-body and drain-to-body capacitances CSB, CDB of the single transistor M4 of the FIGS. 11A-11B can each be modeled as having a value of C. Assuming the same differential voltage VX-(-VX) appears across the single transistor M4 as discussed above in regard to the two-transistor series combination 80$b$ of FIGS. 10A-10B, the voltage VX can appear across both the source-to-body and drain-to-body capacitances CSB, CDB in FIG. 11B, with a differential voltage of zero volts 0V appearing at the intermediate node between these capacitances CSB, CDB. The third order non-linear distortion current contributed by the source-to-body and drain-to-body capacitances CSB, CDB of the single switch transistor M4 can thus be represented as I3=s C VX$^3$.

As can be seen from the above, the impedance selection circuit 68 can reduce distortion without sacrificing low on-resistance. As calculated above, for embodiments having the same effective on-resistance, the third order distortion current of the two-transistor embodiment of the impedance selection circuit 68, or I3=(¼) s C VX$^3$, is four times smaller than the third order distortion current of a single switch transistor, or I3=s C VX$^3$.

Figure 12A:
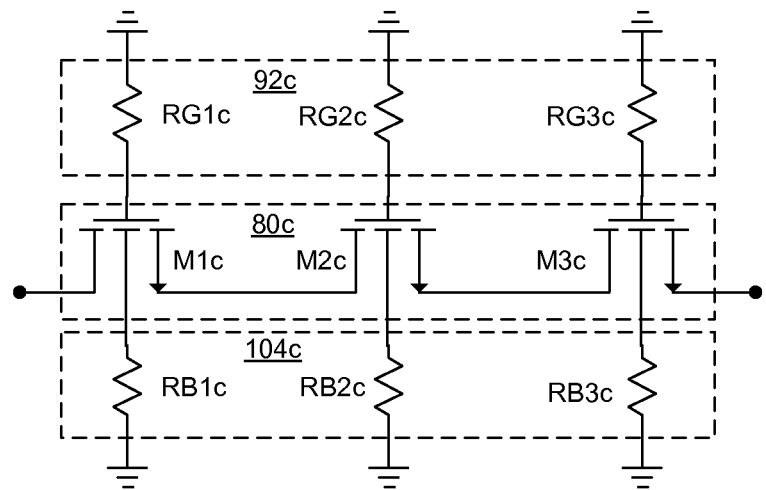
FIGS. 12A-12B are circuit schematics depicting AC circuit models of portions of an embodiment of the impedance selection circuit of FIGS. 6-7, having three series-connected switch transistors.
Figure 12B:
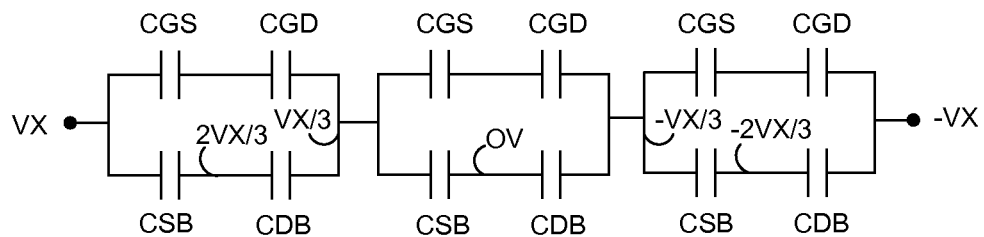

The distortion performance of the impedance selection circuit 68 can be further improved by increasing the number of transistors of the plurality of series-connected transistors 80. FIGS. 12A-12B depict AC circuit models of a portion of an embodiment of the impedance selection circuit 68 having three series-connected transistors 80$c$. FIG. 12A depicts an AC circuit model of first, second and third series-connected transistors M1$c$, M2$c$, M3$c$ along with a corresponding gate drive impedance network 92$c$, having first, second and third gate drive impedances RG1$c$, RG2$c$, RG3$c$, and body drive impedance network 104$c$, having first, second and third body drive impedances RB1$c$, RB2$c$, RB3$c$. FIG. 12B depicts an AC circuit model of parasitic capacitances of the three series-connected transistors 80$c$. Using an analysis similar to that discussed above, and assuming the same differential voltage VX-(-VX) appears across the three transistor series combination 80$c$, each transistor M1$c$, M2$c$, M3$c$ of FIGS. 12A-12B can have a width of 3 W and a length of L, and the source-to-body and drain-to-body capacitances CSB, CDB of each of the transistors M1$c$, M2$c$, M3$c$ of the FIGS. 12A-12B can be modeled as having a value of 3 C. A voltage magnitude of VX/3 can appear across each of the source-to-body and drain-to-body capacitances CSB, CDB of each of the transistors M1$c$, M2$c$, M3$c$ of the three-transistor series combination 80$c$, with a differential voltage 2VX/3-(-2VX/3) appearing across the nodes between the source-to-body and drain-to-body capacitances CSB, CDB of the first and third transistors M1$c$, M3$c$, a differential voltage of VX/3-(-VX/3) appearing across the nodes between the first transistor M1$c$ and the second transistor M2$c$ and between the second transistor M2$c$ and the third transistor M3$c$, and a differential voltage of zero volts 0V appearing at the node between the source-to-body and drain-to-body capacitances CSB, CDB of the second transistor M2$c$. The third order linear distortion current contributed by the source-to-body and drain-to-body capacitances CSB, CDB of the three-transistor series combination 80$c$ can be represented as I3=(⅑) s C VX$^3$. Thus, the third order distortion current of the three-transistor embodiment of the impedance selection circuit 68 can be nine times smaller than the third order distortion current of a single switch transistor.

In general, the distortion of the impedance selection circuit 68, as represented by the third order distortion current, can be 1/N$^2$ smaller than the distortion of a single transistor selection switch, where N is equal to the number of transistors in the plurality of series-connected transistors 80 of the impedance selection circuit 68, when the on-resistance is held constant between the impedance selection circuit 68 and the single transistor selection switch. The voltage across each of the source-to-body and drain-to-body junctions can be reduced by 1/N, which can reduce the third order distortion current by 1/N$^3$ for same size transistors, and by N/N$^3$, or 1/N$^2$, for transistor sizes adjusted to equalize effective on-resistances.

The impedances of the gate and body drive impedance networks 92, 104 can be selected to enable the substantially even voltage division across the source-to-body and drain-tobody capacitances CSB, CDB of the plurality of series-connected transistors 80, which can contribute to enabling the improved distortion performance of the impedance selection switch 68. The impedances of the gate and body drive impedance networks 92, 104 can be selected to be sufficiently large to effectively electrically float the respective nodes that they drive, or to approximate such a floating state, when the series-connected transistors 80 are off. In one embodiment, this can be achieved by selecting impedance values of the gate and body drive impedance networks 92, 104 to each be at least greater in impedance magnitude than that of each of the parasitic capacitances to which they are connected, at a selected frequency such as, e.g., the resonant frequency of the tunable inductor-capacitor combination 24 in FIG. 1. For example, the body drive impedances (e.g., RB1a, RB2a, RB3a, etc.) driving the bodies of the series-connected transistors 80 can each be selected to have an impedance magnitude at least greater than each of the source-to-body and drain-to-body capacitance magnitudes of the corresponding transistor (e.g., M1a, M2a, M3a, etc.) that they drive, at a selected frequency such as the resonant frequency of the tunable inductor-capacitor combination 24; and the gate drive impedances (e.g., RG1a, RG2a, RG3a, etc.) driving the gates of the series-connected transistors 80 can each be selected to have an impedance magnitudes at least greater than each of the gate-to-source and gate-to-drain capacitance magnitudes of the corresponding transistor (e.g., M1a, M2a, M3a, etc.) that they drive, at a selected frequency such as the resonant frequency of the tunable inductor-capacitor combination 24. In another embodiment, impedance values of the gate and body drive impedance networks 92, 104 can be selected to be much greater in impedance magnitude than that of each of the parasitic capacitances to which they are connected, at the selected frequency. For example, the body drive impedances (e.g., RB1a, RB2a, RB3a, etc.) driving the bodies of each of the series-connected transistors 80 can each be selected to have an impedance magnitude at least one-hundred times greater than each of the source-to-body and drain-to-body capacitance magnitudes of the corresponding transistor (e.g., M1a, M2a, M3a, etc.) that they drive, at a selected frequency such as the resonant frequency of the tunable inductor-capacitor combination 24; and the gate drive impedances (e.g., RG1a, RG2a, RG3a, etc.) driving the gates of each of the series-connected transistors 80 can each be selected to have impedance magnitudes at least one-hundred times greater than each of the gate-to-source and gate-to-drain capacitance magnitudes of the corresponding transistor (e.g., M1a, M2a, M3a, etc.) that they drive, at a selected frequency such as the resonant frequency of the tunable inductor-capacitor combination 24.

The control circuit 112 can provide a plurality of control signals to the plurality of drive impedance networks 92-108 to control the impedance selection circuit 68 to be in either an on state or an off state. In the on state, the plurality of series-connected transistors 80 can be turned on and the selectable impedances 84, 88 placed in electrical communication with, e.g., in parallel with, the fixed impedance 64 of the tunable impedance circuit 60 to adjust the overall impedance of the tunable impedance 60. In the off state, the plurality of series-connected transistors 80 can be turned off and the selectable impedances 84, 88 not placed in electrical communication with, e.g., not in parallel with, the fixed impedance 64 of the tunable impedance circuit 60.

The control circuit 112 can provide one or more control signals to each of the drive impedance networks 92-108. In the embodiment of FIG. 7, having a plurality of NMOS series-connected transistors 80a, the control circuit 112 can provide a single control signal (e.g., corresponding control signals GC, BC, IC) to each of the gate, body and isolation drive impedance networks 92a, 104a, 108a, and a single control signal SDC to a collective source and drain impedance network 96a, 100a. To place the impedance selection circuit 68 in the on state, the control circuit 112 can provide a logic high voltage, or an upper power supply or other relatively high voltage, to the gate and isolation drive impedance networks 92, 108, and a logic low voltage, or a lower power supply or other relatively low voltage, to the source, drain and body impedance networks 96, 100, 104. To place the impedance selection circuit 68 in the off state, the control circuit 112 can provide a logic high voltage, or an upper power supply or other relatively high voltage, to the source, drain, and isolation drive impedance networks 96, 100, 108, and a logic low voltage, or a lower power supply or other relatively low voltage, to the gate and body impedance networks 92, 104. In embodiments having a plurality of PMOS series-connected transistors 80, the control circuit 112 can provide control signals suitable to turn on and off PMOS transistors instead of NMOS transistors. To place an embodiment of the impedance selection circuit 68 having PMOS series-connected transistors 80 in the on state, the control circuit 112 can provide a logic low voltage, or a lower power supply or other relatively low voltage, to the gate drive impedance networks 92, and a logic high voltage, or an upper power supply or other relatively high voltage, to the source, drain and body impedance networks 96, 100, 104. To place such an impedance selection circuit embodiment in the off state, the control circuit 112 can provide a logic low voltage, or a lower power supply or other relatively low voltage, to the source and drain drive impedance networks 96, 100, and a logic high voltage, or an upper power supply or other relatively high voltage, to the gate and body impedance networks 92, 104.

Additional embodiments of the tunable impedance 60 and impedance selection circuit 68 are also possible. For example, although some embodiments of the impedance selection circuit 68 may include a plurality of series-connected NMOS transistors 80, in other embodiments the plurality of series-connected transistors 80 can be PMOS transistors or a mixture of NMOS and PMOS transistors. Although some embodiments of the impedance selection circuit 68 may include a pair of selectable capacitances (e.g., C1a, C2a), in other embodiments the selectable impedances 84, 88 can include capacitances, inductances, resistances, or any mixture thereof. Although some embodiments of the impedance selection circuit 68 may include two selectable impedances 84, 88, other embodiments can include one, three, or any other number of selectable impedances. Although some embodiments of the impedance selection circuit 68 may include individual drive impedance resistors (e.g., RG1a, RB1a, RSD1a, RI1a, etc.), in other embodiments the drive impedances of the drive impedance networks 92-108 can be or include output impedances of transistors of drive circuitry. Although some embodiments of the tunable impedance 60 may include a fixed impedance 64 and a plurality of impedance selection circuits 68, in other embodiments the tunable impedance 60 can include one or more impedance selection circuits 68 without a fixed impedance 64. Although some embodiments of the impedance selection circuit 68 include at least some of all of the gate, source, drain, body and isolation drive impedance networks 92-108, other embodiments may include only some of, such as one or more of, the gate, source, drain, body and isolation drive impedance networks 92-108. For example, some embodiments, such as those including either PMOS or NMOS series-connected switch transistors 80, can include gate, source, drain and body drive impedance networks 92, 96, 100, 104 but not an isolation drive impedance network 108. Although some embodiments may be fabricated using a CMOS process, other embodiments can be fabricated using other processes, such as one or more of bipolar or biCMOS processes. Although some embodiments of control signals for controlling the operation of the impedance selection circuit 68 have been discussed herein, other embodiments of control signals are possible, such as embodiments that include different allocations of one or more of logic high and logic low voltages, intermediate voltages not corresponding to logic levels, and boosted voltages to various of the plurality of control signals delivered to the impedance drive networks 92-108 at various times to induce on and off states of the impedance selection circuit 68.

NMOS and PMOS transistors, as utilized in embodiments of the impedance selection circuit 68 to implement the plurality of series-connected transistors and other elements, may be designed or manufactured in a symmetric fashion so that the source and drain of such transistors are similar or identical in construction. Therefore, in embodiments of the impedance selection circuit 68, identification of particular terminals as either source or drain may be reversible.

Figure 13:
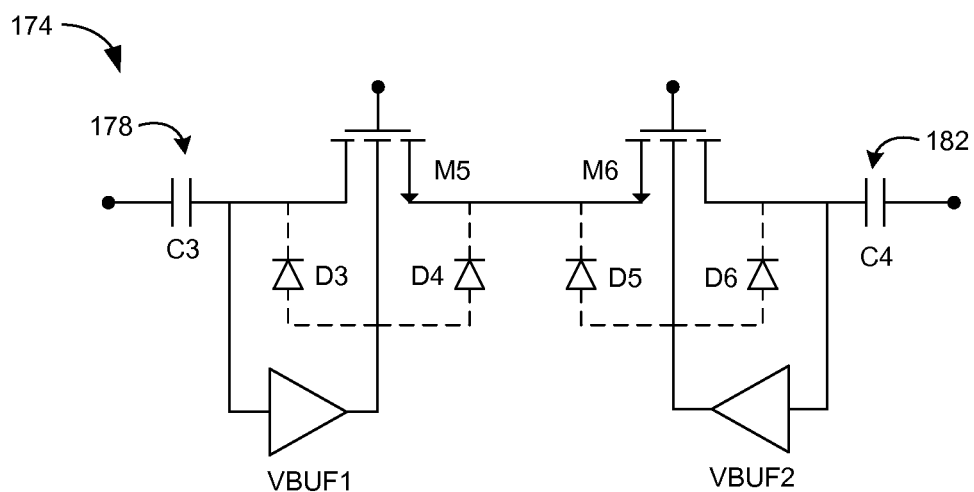
FIG. 13 is a circuit schematic depicting an embodiment of another impedance selection circuit.

FIG. 13 depicts an embodiment of an alternative impedance selection circuit 174 also having an improved distortion performance. The impedance selection circuit 174 of FIG. 13 can include a pair of selectable impedances 178, 182 (e.g., a pair of selectable capacitors C3, C4), a pair of switch transistors M5, M6 having inherent junction diodes D3, D4, D5, D6, and a pair of voltage buffers VBUF1, VBUF2. The impedances 178, 182 can be selected, and thus modify an overall impedance of a tunable impedance including the impedance selection circuit 174, by turning on the pair of switch transistors M5, M6, and unselected by turning off the pair of switch transistors M5, M6. The voltage buffers VBUF1, VBUF2 can reproduce voltages appearing at sources of the transistors M5, M6 to the bodies of the transistors M5, M6. Thus, the voltage across the junction diodes D3-D6 can be constant and no distortion current generated. The voltage buffers VBUF1, VBUF2 can be realized by various embodiments, including, e.g., a unity gain negative feedback operation amplifier configuration.

Figure 14:
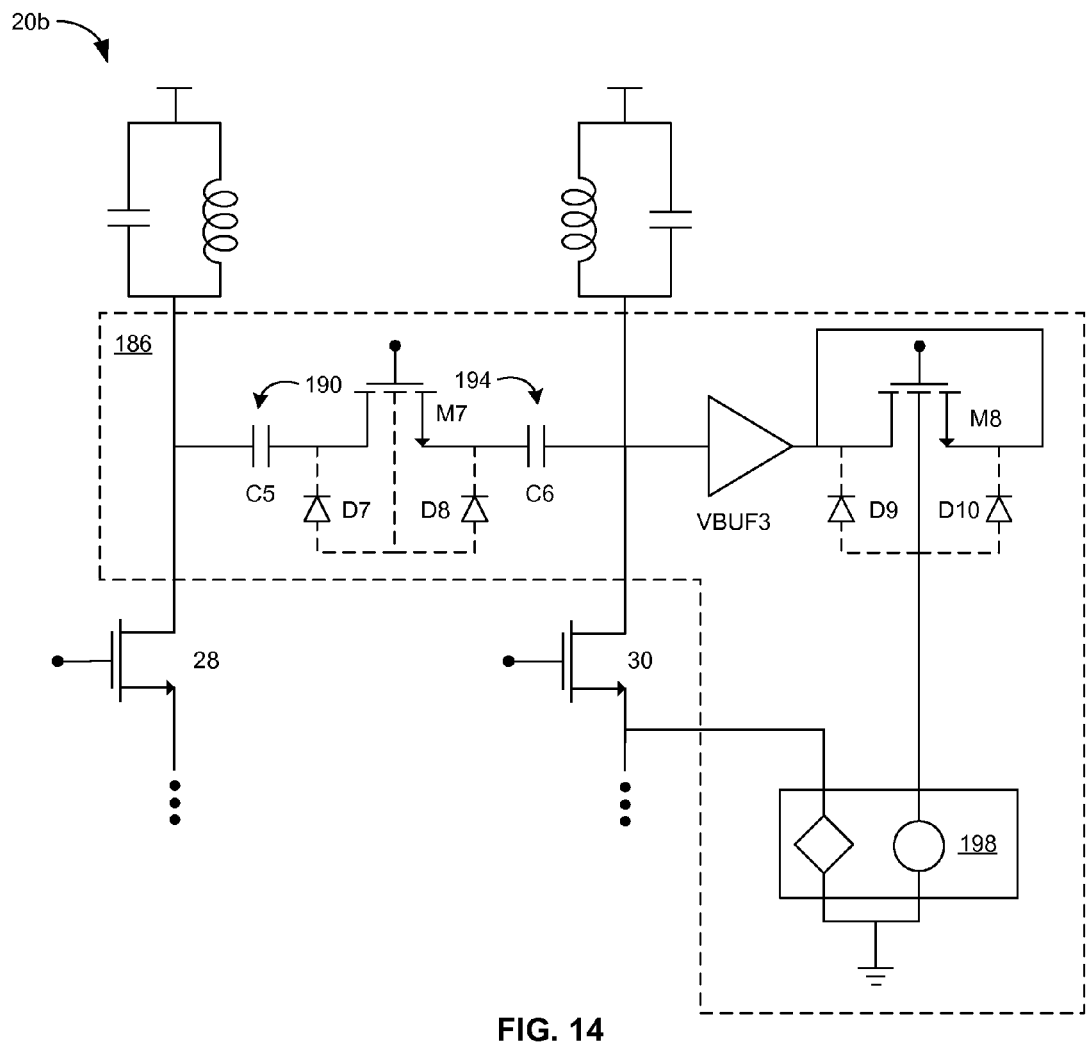
FIG. 14 is a circuit schematic depicting an embodiment of yet another impedance selection circuit.

FIG. 14 depicts an embodiment of another alternative impedance selection circuit 186 embedded in an exemplary embodiment of the oscillator circuit 20b, also having an improved distortion performance. The impedance selection circuit 186 of FIG. 14 can include a pair of selectable impedances 190, 194 (e.g., a pair of selectable capacitors C5, C6) and a switch transistor M7, having inherent junction diodes D7, D8, to select the selectable impedances 190, 194 to modify an overall impedance of a tunable impedance of the oscillator circuit 20b. The impedance selection circuit 186 can also include a second transistor M8, to replicate the first transistor M7 and the distortion current produced by it, connected to the selectable impedance 194 by a voltage buffer VBUF3 and with source and drain connected together. The second transistor M8 can include inherent junction diodes D9, D10. The second transistor M8 can optionally have a reduced size in comparison to the first transistor M7, and thus its replicated distortion current can have a similarly reduced size. The replicated distortion current can be fed to a current controlled current source 198, which can provide the replicated distortion current, and perform any current size adjustments necessary to boost the replicated current to the value of the distortion current in the first transistor M7 in the case of a reduced size second transistor M8, to a current feeding transistor 30 (e.g., cross-coupled transistor 30) of the oscillator circuit 20b connected to the selectable impedance 194 of the impedance selection circuit 186, but in a polarity reversed from the polarity of the distortion current that the first transistor M7 feeds into the same portion of the oscillator circuit 20b. The replicated distortion current can thus cancel the distortion current of the first transistor M7, thereby improving distortion performance. The current controlled current source 198 can be realized by various embodiments, including by a current mirror transistor configuration. The voltage buffer VBUF3 can be realized by various embodiments, including, e.g., a unity gain negative feedback operation amplifier configuration.

Figure 15:
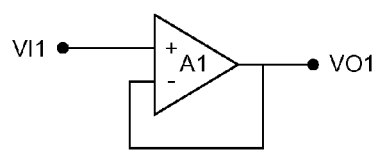
FIG. 15 is a circuit schematic depicting an embodiment of a voltage buffer circuit.

FIG. 15 depicts an exemplary embodiment of a unity-gain negative-feedback operational-amplifier configuration that can be used to implement the voltage buffers VBUF1-VBUF3 of the impedance selection circuits 174, 186 of FIGS. 13 and 14. The depicted embodiment includes an operational amplifier A1 having a positive input terminal to receive an input voltage VI1, a negative input terminal connected to an output terminal, and the output terminal to provided an output voltage VO1 representing a buffered, unity-gain version of the received input voltage VI1.

Figure 16:
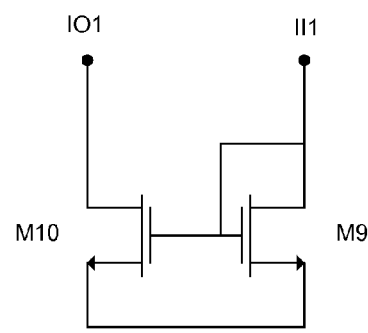
FIG. 16 is a circuit schematic depicting an embodiment of a current-controlled current-source circuit.

FIG. 16 depicts an exemplary embodiment of a current-mirror transistor configuration that can be used to implement the current-controlled current-source 198 of FIG. 14. The depicted embodiment includes a pair of transistors M9, M10, having gates and sources respectively connected together, a first of the transistors M9 having its gate also connected to its drain and receiving an input current II1, the second transistor M10 providing an output current IO1 at its drain. The transistors M9, M10 can be selectively sized relative to each other to provide any needed current gain or reduction between the input and output currents II1, IO1.

Any feature of any of the embodiments of the impedance selection circuits 68, 174, 186, described herein can optionally be used in or with any other embodiment of the impedance selection circuits 68, 174, 186. Embodiments of the impedance selection circuits 68, 174, 186 can also optionally include any subset of the components or features of any embodiments of the impedance selection circuits 68, 174, 186 described herein.

What is claimed is:

1. A tunable impedance circuit for connecting one or more impedances to, and improving the distortion performance of, a resonant circuit, comprising:
   a fixed impedance;
   an impedance selection circuit to connect first and second impedances in parallel with the fixed impedance, the impedance selection circuit comprising:
     the first impedance connected to a first interface terminal;
     the second impedance connected to a second interface terminal;
     a plurality of series-connected transistors connected between the first and second impedances and configured to connect the first and second impedances electrically in parallel with the fixed impedance when turned on and disconnect the first and second impedances from being electrically in parallel with the fixed impedance when turned off;
     a plurality of drive impedance networks connected to gates, sources, drains, bodies, and isolation regions of the series-connected transistors, the plurality of drive impedance networks including:
       a gate drive impedance network having a plurality of gate drive resistors, each gate drive resistor connected between a gate of a respective one of the plurality of series-connected transistors and a common gate control line and having an impedance magnitude greater than impedance magnitudes of gate-to-source and gate-to-drain capacitances of the respective series-connected transistor at a resonant frequency of the resonant circuit; and
a body drive impedance network having a plurality of body drive resistors, each body drive resistor connected to a body of a respective one of the plurality of series-connected transistors; and
a control circuit connected to the plurality of drive impedance networks to turn on and turn off the series-connected transistors.

2. The tunable impedance circuit of claim 1, further comprising a plurality of the impedance selection circuits, each connected in parallel with the fixed impedance, and wherein, for each impedance selection circuit, turning on and turning off the respective plurality of series-connected transistors brings the series combination of the respective first and second impedances into and out of parallel electrical communication with the fixed impedance.

3. The tunable impedance circuit of claim 1, wherein the fixed impedance, first impedance and second impedance each comprise a respective capacitor.

4. The tunable impedance circuit of claim 1, wherein the plurality of series-connected transistors of the impedance selection circuit includes at least two series connected transistors.

5. The tunable impedance circuit of claim 1, wherein the plurality of series-connected transistors of the impedance selection circuit includes at least three series connected transistors.

6. The tunable impedance circuit of claim 1, wherein the control circuit is configured to provide a gate control signal to the common gate control line to turn on and turn off the plurality of series-connected transistors.

7. The tunable impedance circuit of claim 1, wherein the plurality of drive impedance networks include a combined source and drain drive impedance network having a plurality of resistors, at least a respective one of the plurality of resistors connecting each of the sources and drains of the plurality of series-connected transistors to a source and drain control line connected to the control circuit,
wherein the control circuit is configured to provide a source and drain control signal to the source and drain control line to turn on and turn off the plurality of series-connected transistors.

8. The tunable impedance circuit of claim 1, wherein each body drive resistor connects the body of the respective one of the plurality of series-connected transistors to a body control line connected to the control circuit,
wherein the control circuit is configured to provide a body control signal to the body control line when turning on and turning off the plurality of series-connected transistors.

9. The tunable impedance circuit of claim 1, wherein the plurality of drive impedance networks include an isolation drive impedance network having a plurality of resistors, each resistor connecting an isolation region of a respective one of the plurality of series-connected transistors to an isolation region control line connected to the control circuit,
wherein the control circuit is configured to provide an isolation region control signal to the isolation region control line when turning on and turning off the plurality of series-connected transistors.

10. The tunable impedance circuit of claim 1, wherein the plurality of series-connected transistors are NMOS transistors.

11. The tunable impedance circuit of claim 10, wherein each NMOS transistor includes n-type source and drain regions, a p-type body region containing the source and drain regions, an n-type isolation region containing the body region, and a p-type substrate region containing the isolation region.

12. The tunable impedance circuit of claim 11, wherein each NMOS transistor includes a separate isolation region electrically isolated from the isolation regions of the other NMOS transistors.

13. The tunable impedance circuit of claim 1, wherein the plurality of series connected transistors are PMOS transistors.

14. An oscillator comprising the tunable impedance circuit of claim 1, the oscillator further comprising:
an inductor connected to the tunable impedance circuit and to an upper power supply line;
a pair of cross-coupled transistors connected across the tunable impedance circuit and to a voltage controlled current source, the pair of cross-coupled transistors including first and second transistors, the first transistor having a gate connected to a drain of the second transistor, the second transistor having a gate connected to a drain of the first transistor, sources of the first and second transistors connected to an output of the voltage-controlled current source, and drains of the first and second transistors connected to the tunable impedance circuit;
the voltage-controlled current source, having an output connected to sources of the cross-coupled transistors and a plurality of transistors each configured to selectively provide a respective current to the output of the current source in response to a respective one of a plurality of control signals provided by the control circuit.

15. A tunable impedance circuit, comprising:
a fixed impedance;
an impedance selection circuit, comprising:
a first impedance connected to a first interface terminal;
a second impedance connected to a second interface terminal;
first and second transistors connected in series between the first and second impedances;
a first voltage buffer connecting a node connecting the first impedance and the first transistor to a body of the first transistor; and
a second voltage buffer connecting a node connecting the second impedance and the second transistor to a body of the second transistor.

16. The tunable impedance circuit of claim 15, further comprising a plurality of the impedance selection circuits, each connected in parallel with the fixed impedance, and wherein, for each impedance selection circuit, turning on and turning off the first and second transistors brings the series combination of the respective first and second impedances into and out of parallel electrical communication with the fixed impedance.

17. The tunable impedance circuit of claim 15, wherein the first and second voltage buffers each comprise a unity-gain negative-feedback operational-amplifier configuration.

18. An oscillator comprising the tunable impedance circuit of claim 15, the oscillator further comprising:
an inductor connected to the tunable impedance circuit and to an upper power supply line;
a pair of cross-coupled transistors connected across the tunable impedance circuit and to a voltage controlled current source, the pair of cross-coupled transistors including first and second transistors, the first transistor having a gate connected to a drain of the second transistor, the second transistor having a gate connected to a drain of the first transistor, sources of the first and second transistors connected to an output of the voltage-controlled current source, and drains of the first and second transistors connected to the tunable impedance circuit;

the voltage-controlled current source, having an output connected to sources of the cross-coupled transistors and a plurality of transistors each configured to selectively provide a respective current to the output of the current source in response to a respective one of a plurality of control signals provided by the control circuit.

19. A tunable impedance circuit, comprising:
a fixed impedance;
an impedance selection circuit, comprising:
   a first impedance connected to a first interface terminal;
   a second impedance connected to a second interface terminal;
   a first transistor connected between the first and second impedances;
   a voltage buffer connecting the second interface terminal to a second transistor;
   the second transistor, having a source and a drain connected together and to the voltage buffer; and
   a current controlled current source connected to a body of the second transistor, wherein the current controlled current source provides an output current based on a current received from the body of the second transistor.

20. The tunable impedance circuit of claim 19, further comprising a plurality of the impedance selection circuits, each connected in parallel with the fixed impedance, and wherein, for each impedance selection circuit, turning on and turning off the first and second transistors brings the series combination of the respective first and second impedances into and out of parallel electrical communication with the fixed impedance.

21. The tunable impedance circuit of claim 19, wherein the voltage buffer comprises a unity-gain negative-feedback operational-amplifier configuration.

22. The tunable impedance circuit of claim 19, wherein the current controlled current source comprises a current mirror transistor configuration.

23. An oscillator comprising the tunable impedance circuit of claim 19, the oscillator further comprising:

an inductor connected to the tunable impedance circuit and to an upper power supply line;

a pair of cross-coupled transistors connected across the tunable impedance circuit and to a voltage controlled current source, the pair of cross-coupled transistors including first and second transistors, the first transistor having a gate connected to a drain of the second transistor, the second transistor having a gate connected to a drain of the first transistor, sources of the first and second transistors connected to an output of the voltage-controlled current source, and drains of the first and second transistors connected to the tunable impedance circuit;

the voltage-controlled current source, having an output connected to sources of the cross-coupled transistors and a plurality of transistors each configured to selectively provide a respective current to the output of the current source in response to a respective one of a plurality of control signals provided by the control circuit.

24. The tunable impedance circuit of claim 8, wherein the body control signal switches between a first voltage and a second voltage when turning on and turning off the plurality of series-connected transistors.

25. The tunable impedance circuit of claim 9, wherein the isolation region control signal switches between a first voltage and a second voltage when turning on and turning off the plurality of series-connected transistors.

26. The tunable impedance circuit of claim 1, wherein each body drive resistor has an impedance magnitude greater than impedance magnitudes of source-to-body and drain-to-body capacitances of the respective series-connected transistor at a resonant frequency of the resonant circuit.

27. The tunable impedance circuit of claim 26, wherein the impedance magnitudes of the body drive resistors provide a substantially even voltage division across source-to-body and drain-to-body capacitances of the plurality of series-connected transistors at the resonant frequency of the resonant circuit.

28. The tunable impedance circuit of claim 26, wherein the impedance magnitudes of the gate drive resistors effectively electrically float the gates of the plurality of series-connected transistors when the plurality of series-connected transistors are turned off.

* * * * *